(12) United States Patent
Chang et al.

(10) Patent No.: US 6,996,767 B2
(45) Date of Patent: Feb. 7, 2006

(54) MEMORY CONFIGURATION SCHEME ENABLING PARALLEL DECODING OF TURBO CODES

(75) Inventors: Hyokang Chang, Potomac, MD (US); Seok Ho Kim, North Potomac, MD (US)

(73) Assignee: ComBasis Technology, Inc., Rockville, MD (US)

( * ) Notice: Subject to any disclaimer, the term of this patent is extended or adjusted under 35 U.S.C. 154(b) by 484 days.

(21) Appl. No.: 10/211,479

(22) Filed: Aug. 2, 2002

(65) Prior Publication Data

US 2003/0028843 A1 Feb. 6, 2003

Related U.S. Application Data

(60) Provisional application No. 60/309,765, filed on Aug. 3, 2001.

(51) Int. Cl.
*H03M 13/00* (2006.01)
(52) U.S. Cl. ...................................... 714/786
(58) Field of Classification Search ............... 714/752, 714/755, 786; 375/262, 341
See application file for complete search history.

(56) References Cited

U.S. PATENT DOCUMENTS

| | | | |
|---|---|---|---|
| 6,182,261 B1 | 1/2001 | Haller et al. | |
| 6,292,918 B1 | 9/2001 | Sindhushayana et al. | |
| 6,298,463 B1 * | 10/2001 | Bingeman et al. | 714/786 |
| 6,304,995 B1 | 10/2001 | Smith et al. | |
| 6,484,283 B2 * | 11/2002 | Stephen et al. | 714/786 |
| 6,516,437 B1 * | 2/2003 | Van Stralen et al. | 714/755 |
| 6,760,879 B2 * | 7/2004 | Giese et al. | 714/755 |
| 6,813,742 B2 * | 11/2004 | Nguyen | 714/794 |

* cited by examiner

*Primary Examiner*—Shelly Chase
(74) *Attorney, Agent, or Firm*—Roberts, Abokhair & Mardula, LLC (57) ABSTRACT

A memory configuration scheme that enables parallel decoding of a single block of turbo-encoded data is described. In this scheme a single code block is divided into multiple subblocks and decoding is performed on subblocks in parallel. The turbo decoder memory is configured so that subblock decoders can access the common memory resources independently of each other. This scheme is different from existing parallel decoding schemes in that it achieves the parallel implementation by applying multiple decoders to a single code block, not by assigning multiple decoders to multiple code blocks. The advantages of this scheme include minimum memory requirement and minimum decoding latency. The minimum memory requirement results from the fact that it needs memory resources only for a single code block regardless of the number of decoders used. The decoding latency is minimum since decoding of a code block is over when decoding on subblocks is completed.

5 Claims, 12 Drawing Sheets

MEMORY CONFIGURATION SCHEME ENABLING PARALLEL DECODING OF TURBO CODES

CROSS REFERENCE TO RELATED APPLICATIONS

This application claims priority under 35 U.S.C. § 119(e) from provisional application No. 60/309,765, filed Aug. 3, 2001. The 60/309,765 provisional application is incorporated by reference herein, in its entirety, for all purposes.

FIELD OF INVENTION

The present invention relates generally to decoding schemes for a class of codes called turbo codes. Turbo codes are employed for reliable transmission of voice, data, and video signals in advanced wireless and wired systems for their superior error correcting capabilities.

BACKGROUND OF THE INVENTION

Transmission of digital data is inherently prone to interference, which may introduce errors into the transmitted data. Error detection schemes have been suggested to determine as reliably as possible whether errors have been introduced into the transmitted data. For example, it is common to transmit the data in packets, and add to each packet a CRC (cyclic redundancy check) field, for example of a length of 16 bits, which carries a checksum of the data of the packet. When a receiver receives the data, it calculates the same checksum on the received data and verifies whether the result of its calculation is identical to the checksum in the CRC field.

Data signals, in particular those transmitted over a typically hostile RF interface, are susceptible to errors caused by interference. Various methods of error correction coding have been developed in order to minimize the adverse effects that a hostile interface has on the integrity of communicated data. This is also referred to as lowering the Bit Error Rate (BER), which is generally defined as the ratio of incorrectly received information bits to the total number of received information bits. Error correction coding generally involves representing digital data in ways designed to be robust with respect to bit errors. Error correction coding enables a communication system to recover original data from a signal that has been corrupted. Typically, the greater the expected BER of a particular communication link, the greater the complexity of the error correction coding necessary to recover the original data. In general, the greater the complexity of the error correction coding, the greater the inefficiency of the data communication. The greater inefficiency results from a reduction of the ratio of information bits to total bits communicated as the complexity of the error correction coding increases. The increased number of bits introduced into the original body of data by error correction coding consumes spectrum bandwidth and processor cycles on both the transmitting and receiving ends of the communication.

Figure 1:
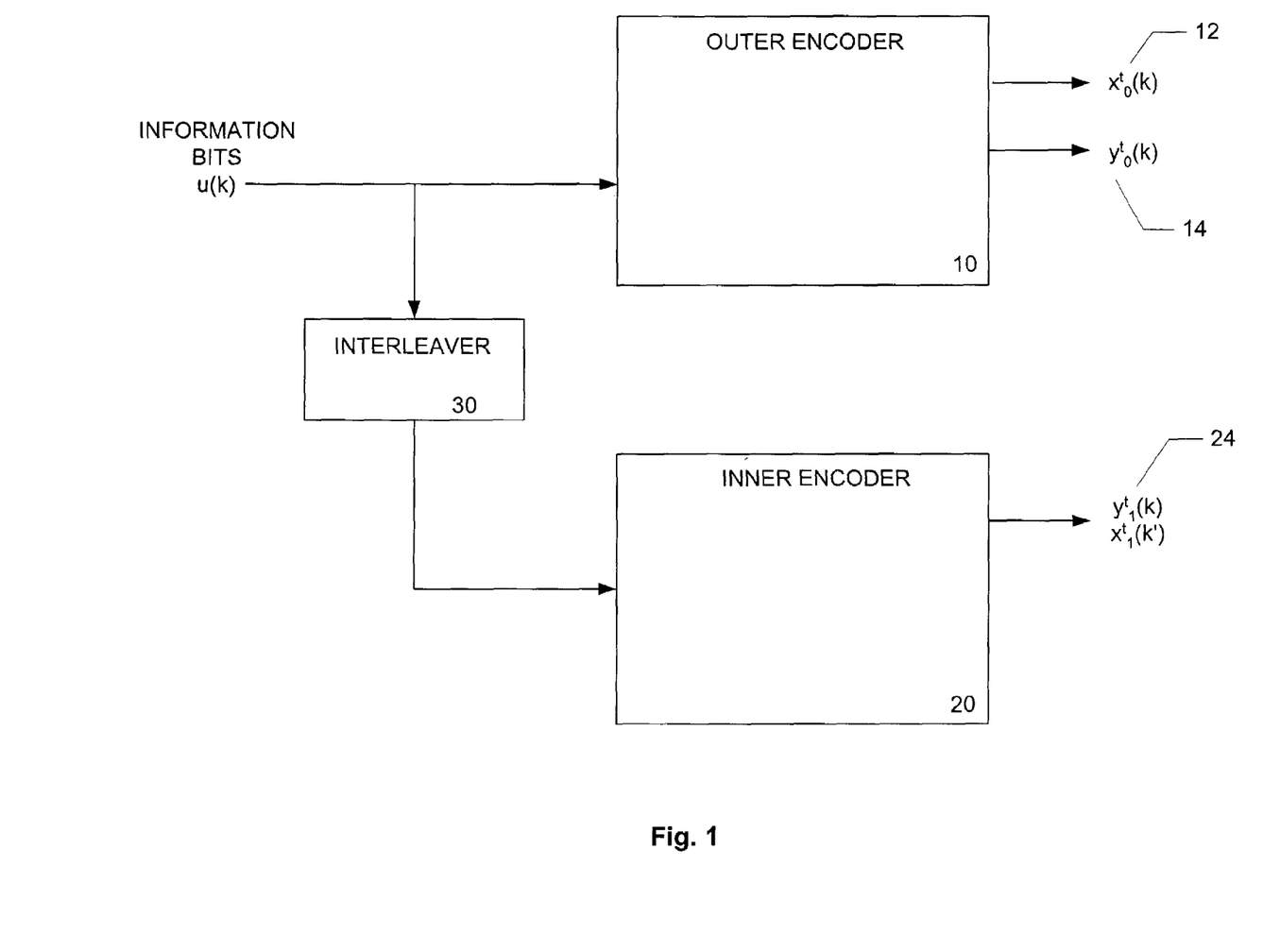
FIG. 1 illustrates a Turbo Encoder with Rate ⅓.

Turbo coding plays an important role in communications systems because of its outstanding coding gain with relatively manageable decoding complexity. Typical turbo codes employed in communications systems are based on a parallel concatenated constituent coding (PCCC) scheme. An example of a turbo encoder with rate 1/3 is illustrated in FIG. 1. In this scheme two systematic convolutional encoders, an outer encoder 10 and an inner encoder 20, are parallel concatenated via a turbo interleaver 30. In this example a convolutional encoder of constraint length 4 is used as a constituent encoder. The coding rate of the example shown is 1/3. Systematic information from the outer encoder in totality is represented as $x^t{}_0(k)$ 12. The outer encoder also generates informational bits, $y^t{}_0(k)$ 14. Output from the inner encoder is represented as $x^t{}_1(k')$, where k' is an interleaved index, and $y^t{}_1(k)$ (information bits) 24.

Concatenated error correction coding is a sequence of coding in which at least two encoding steps are performed on a data stream. Concatenated coding may be performed in series (i.e., the first encoding is further encoded in a serial fashion) or in parallel. Parallel encoding subjects the original data to different encoding schemes resulting in intermediate codes that are then further processed and combined into a serial stream.

A parallel concatenated turbo coding scheme starts with a block of data that is encoded with a particular coding method resulting in systematic bits and parity bits. Additionally, the original block of data may be rearranged with a permuter. The bits are permuted (re-ordered) so that interference (noise) does not affect adjacent bits in their normal order. This scheme of spreading normally adjacent bits enhances the ability to recover from interference distortions.

The permuted bits are then encoded with the same method as that applied to the original data resulting in systematic bits (which may be discarded) and parity bits. The two sets of encoded data are then further processed and merged (interleaved) into a serial bit stream. The complexity of parallel concatenated coding depends on the chosen encoding scheme and can become significantly complex.

The amount of processing necessary to decode such convolutionally encoded data can be considerable. Parallel and serial concatenated codes are sometimes decoded using iterative decoding algorithms. One commonly employed method of iterative decoding utilizes a single decoder processor where the decoder output metrics are fed back to the input of the decoder processor. Decoding is performed in an iterative fashion until a terminating condition has been reached. A primary example is a turbo decoder.

Figure 2:
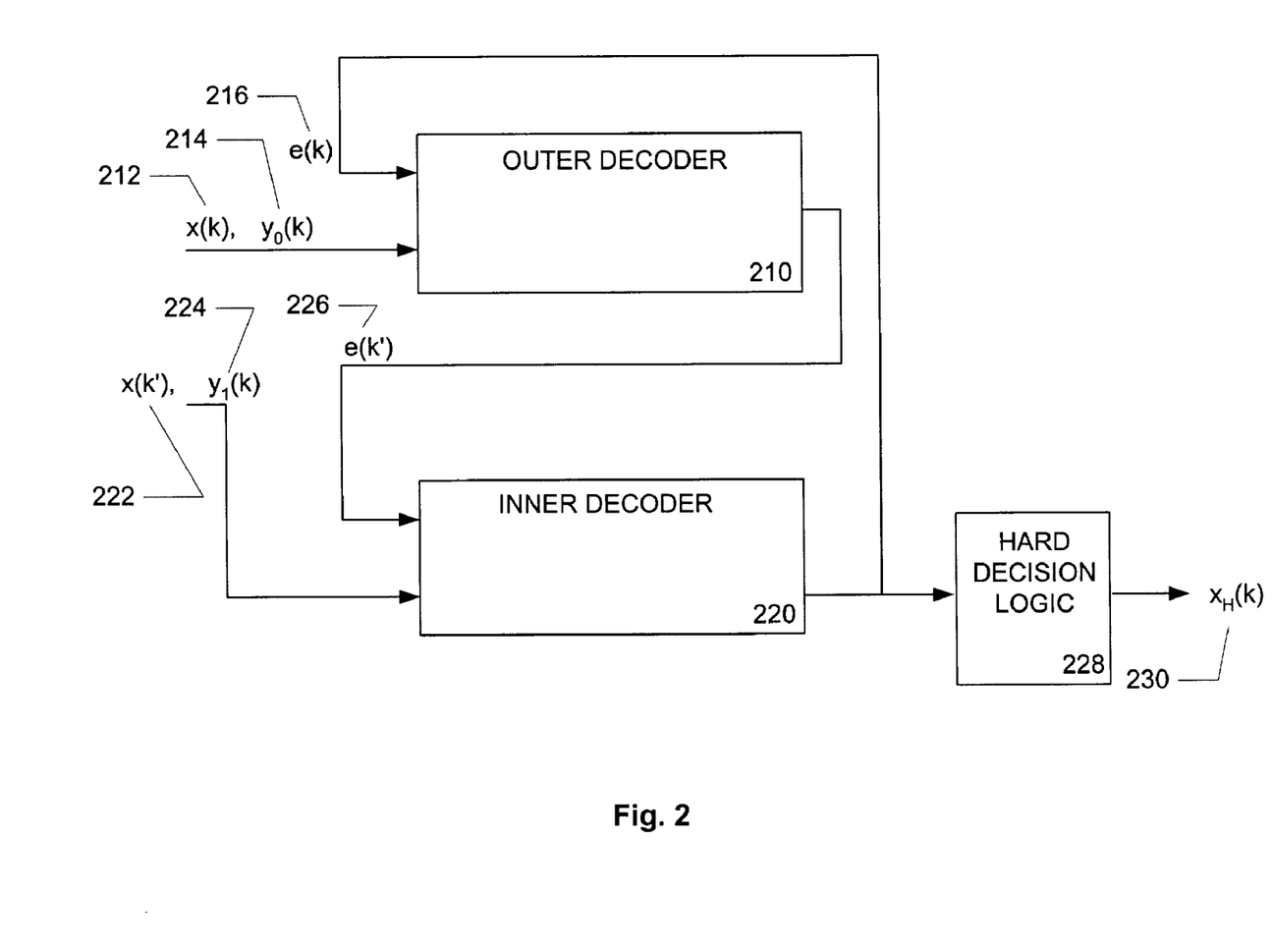
FIG. 2 illustrates a functional block diagram of turbo decoder.

Turbo decoding is accomplished by employing two constituent decoders. The outer decoder and inner decoder generate log-likelihood ratios (LLR) called extrinsic information. The extrinsic information is fed back from one decoder to the other iteratively. A functional block diagram of a turbo decoder is illustrated in FIG. 2 where x(k) 212, $y_0(k)$ 214, and $y_1(k)$ 224 represent received samples of the encoder outputs, $x^t{}_0(k)$ 12, $y^t{}_0(k)$ 14, and $y^t{}_1(k)$ 24, respectively. As illustrated in FIG. 2, the outer decoder takes on received samples, x(k) 212 and $y_0(k)$ 214, and extrinsic information, e(k) 216, generated by the inner decoder 220 where k denotes the symbol index. Similarly, the inner decoder takes on receive samples, x(k') 222 and $y_1(k)$ 224, and extrinsic information, e(k') 226, generated by the outer decoder 210 where k' denotes the interleaved symbol index. Each time a constituent decoder is run, the extrinsic information is updated for the other decoder and the decoder performance gets enhanced iteratively. One iteration is completed when a single pass of decoding is performed for both the outer decoder 210 and the inner decoder 220. In this implementation, one pass of decoding requires memory accesses to N symbol data either in normal or interleaved order. That is, each pass of decoding requires at least N memory access clocks. The output of the decoder is passed through hard_decision logic 228. Input values to hard-decision logic are grey-scale values, i.e. a value somewhere between 0 and 1. The hard-decision logic converts it to 0 if its value is less than 0.5, to 1 and provides this value as output 230.

Figure 3:
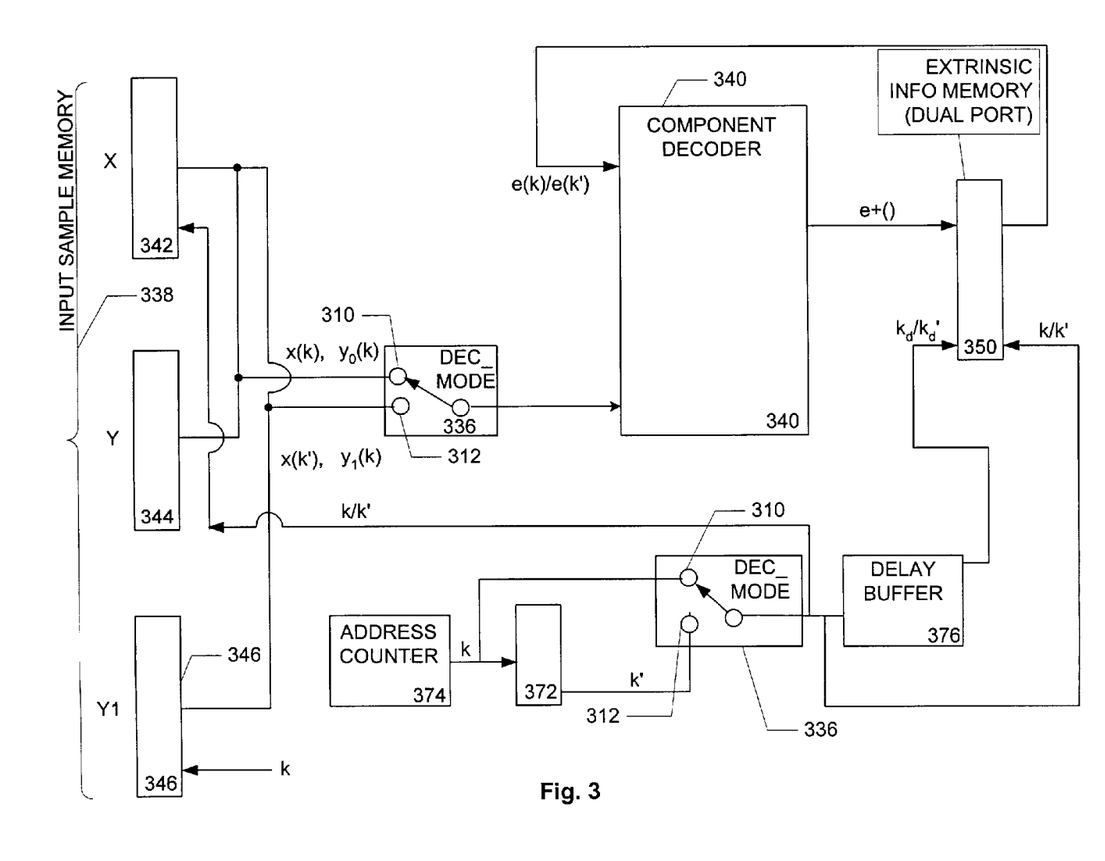
FIG. 3 illustrates a typical implementation of turbo decoder.

A typical implementation of a turbo decoder is illustrated in FIG. 3, where the turbo decoding logic is shared between the two decoding modes, outer decoding mode 310 and inner decoding mode 312. Switches 336 provide the data path switching between the two decoding modes. In this implementation there are three major memory blocks associated with the input 338, output 350, and control data 372 of the turbo decoding logic are illustrated. These are input sample 338, extrinsic information 350, and interleaved address memories 372. In the preferred embodiment, the extrinsic information memory is a dual port memory and the path metric memory used during the decoding process is internal to the decoding logic. Further, a dual port memory 352 is employed for the extrinsic information 350. The interleaver address memory associates the interleaver address with an address counter 374.

In order for the decoder processor to decode the encoded input data at the same rate as the input data is arriving, the component decoder processor 340 must process the encoded data at a rate faster than the rate of the incoming data by a factor at least equal to the number of iterations necessary. With this method of iterative decoding, the speed of the decoder processor becomes a significantly limiting factor in the system design. Schemes to accelerate the decoding process include accelerating the decoder and accelerating the recognition of the decoding terminating event.

In order to improve processing times, parallel decoding schemes have been devised. One scheme is to use multiple processors to decode in parallel. U.S. Pat. No. 6,292,918 to Sindhushayana et al. entitled "Effective Iterative Decoding" (the '918 patent), describes a decoder that uses multiple processors to decode turbo code in parallel. In this approach, two decoders—an inner decoder and an outer decoder—work on two code blocks. The underlying concept is that the inner decoder processes a first code block while the outer decoder processes a second code block. Upon completion of current phases of decoding these two decoders exchange outputs and repeat the decoding process so that each code block goes through both phases of decoding, outer decoding and inner decoding. Efficiency is based on the theory that both the inner and outer decoders are fully utilized, i.e. the outer decoder does not wait until the inner decoder completes its decoding and vice versa.

U.S. Pat. No. 6,182,261 to Haller et al. entitled "Effective Iterative Decoding", the '261 patent, a continuation in part of the application for the '918 patent, discloses a decoder scheme in which the inner and outer decoding processes can be performed independently. That is, as soon a decoder is finished processing a first block, the same decoder is able to decode a second block without having to wait for the other decoder to complete a decoding the first block of code.

U.S. Pat. No. 6,304,995 to Smith et al. entitled "Pipelined Architecture to Decode Parallel and Serial Concatenated Codes", the '995 patent, describes a scheme for processing concatenated encoded data in a cascading fashion. This scheme allows a plurality of processors to decode in parallel, thus accelerating the decoding process similar to the concept of parallel processing using multiple processors in '918.

U.S. Pat. Nos. '918, '261 and '995 disclose multiple processors to decode in a parallel fashion. Further, each of the cited patents decodes full blocks of encoded data at each decoder. The schemes provide for complementary decoders to either process a single data block in different modes (i.e., "inner" and "outer" decoding modes) in parallel or for independent decoders to process two different data blocks in parallel. Since each of the disclosed decoders operates in parallel, the number of clock cycles used to address memory is the same for each processor/decoder. The theoretical increase in decoding speed is premised on obtaining two decoding cycles for each clock cycle. This approach, however, requires two physical decoders and two sets of memories for two code blocks.

What is desired is a turbo decoding process without the complexity associated with using discrete decoders for parallel processing but that achieves a decoding rate that is equal to, or better than, such discrete decoder parallel processing systems.

SUMMARY OF THE INVENTION

The present invention is a system and method for configuring the input and other data memories of a turbo decoder that enables parallel decoding of turbo codes by "Q" component decoders, where "Q" is an integer greater than one.

It is therefore an objective of the present invention to implement a turbo decoder using a single discrete decoder subdivided into two component decoders that access memory in parallel.

It is a further objective of the present invention provides to determine the initial state condition for one decoder component and the final state condition for the other decoder component with little overhead.

It is still another objective of the present invention to have two component decoders, running in parallel, independently decode respective halves of an encoded data block in an "outer" mode.

It is still a further objective of the present to have two component decoders, running in parallel, independently decode respective halves of an interleaved set of extrinsic data in an "inner" mode.

It is yet another objective of the present invention to access memory simultaneously by providing two sets of dual port memories for extrinsic information so that the two component decoders during inner decoding can read and write extrinsic information independently.

It is yet a further objective to use two sets of single port memory buffers to receive output in outer decoding mode.

Figure 4:
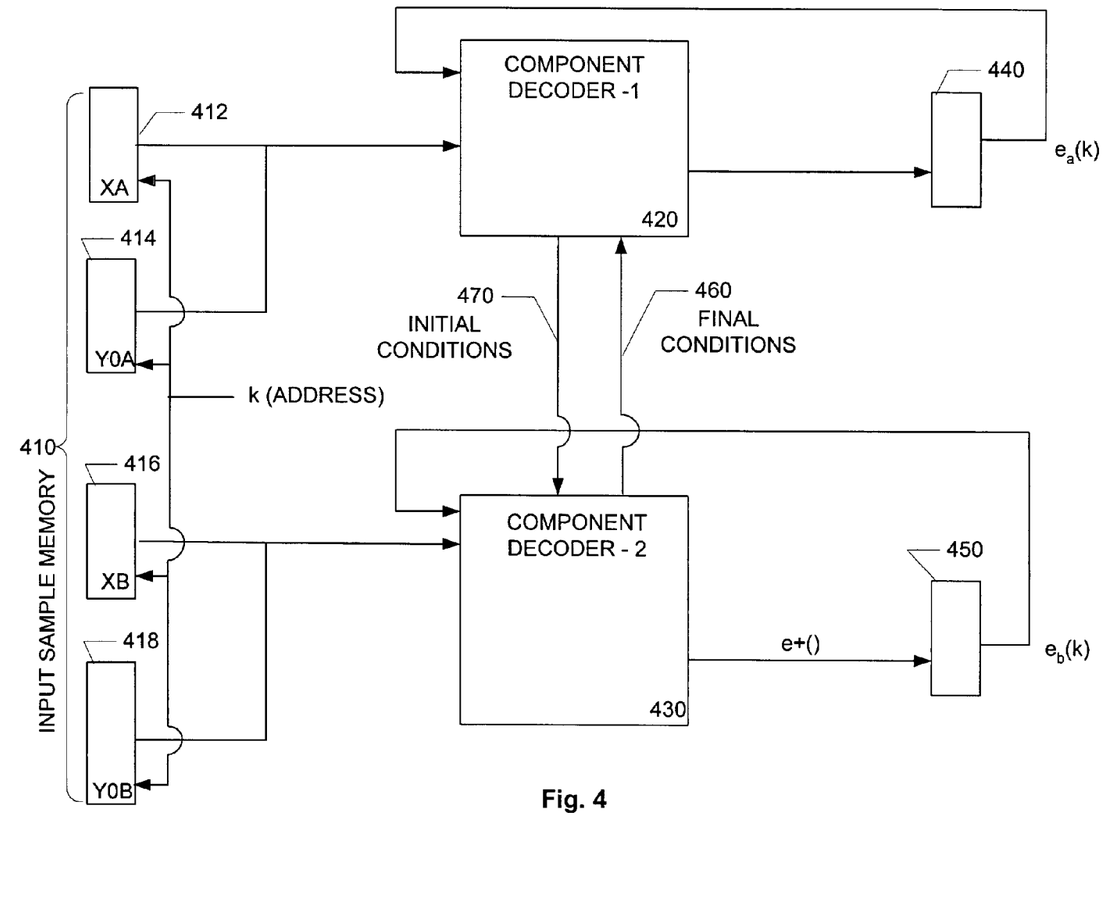
FIG. 4 illustrates the memory management configuration for parallel decoding in outer decoding mode of the present invention.

These and other objectives of the present invention will become apparent from a review of the general and detailed descriptions that follow. The present invention uses a memory configuration scheme in conjunction with a single processor to achieve parallel processing of turbo-encoded data. Referring to FIG. 4, the memory management configuration for parallel decoding in the outer decoding mode is illustrated. The decoder comprises decoder component-1 420 and decoder component-2 430 and is configured such that each decoder component decodes one-half of the encoded symbols received from parallel turbo encoders. The decoder uses an "A Posteriori Probability (APP)" decoding scheme. The decoder is termed an APP decoder, also referred to as a "Maximum A Posteriori" (MAP) decoder. The received encoded information is split into equal blocks into two memory block pairs, XA 412, YOA 414, XB 416, and YOB 418, where "X" memory holds data samples received and YO memory holds parity bit samples in sequential (non-interleaved) order. Similarly, the extrinsic memory is divided into two memory blocks EA 440 and EB 450. The memory management scheme of the present invention stores the output of each decoder component into indexed memory for retrieval.

Prior to the initiation of decoding, a training algorithm is processed by each of the decoder components in order to obtain a final state of decoder component-1 and the initial state of the decoder component-2. Once the initial and final state conditions are established, the two component decoders process in parallel and independent of each other.

The memory configuration scheme of the present invention is arranged in memory blocks that are assigned and indexed to the decoder components depending on the mode of decoding being performed. In the preferred embodiment, the memory configuration scheme assigns separate memory blocks to store the de-interleaved output of the first decoder component and the inter-interleaved output of the second decoder component. Referring again to FIG. 4, when the decoder is operating in an inner decode mode, decoder component-1 reads extrinsic information from EA 440 and writes decoded data to that block. Decoder component-2 reads extrinsic information from EB 450 and writes decoded data to that block. Both decoder components write decoded data in sequential order (i.e., non-interleaved) to their assigned memory blocks.

When the decoder is processing in an outer decode mode, equal sized input blocks and extrinsic data blocks are employed. Each component decoder iteratively decodes the symbols based on extrinsic data that changes with each decode iteration The present invention decodes in a single mode, either "inner" or "outer" mode, until decoding for that particular mode is complete. Each component decoder processes half of the symbols independently and in parallel. The memory management configuration of the present invention allows the two independent component decoders to process a partial block of data and maintain correct indexing, whether the component decoders are in an "outer" decoding mode or an "inner" decoding mode. Further, the memory management, including the use of multiple dual port extrinsic data input buffers, controlled by a control signal logic (illustrated in FIG. 7 and described below), allows the independent component decoders to access the memory in parallel.

DETAILED DESCRIPTION OF THE INVENTION

The present invention is a system and method for configuring the input and other data memories of a turbo decoder that enables parallel decoding of turbo codes by "Q" component decoders, where "Q" is an integer greater than one. The present invention divides incoming encoded data block into as equal as possible Q sub-blocks. The detailed description that follows assumes a factor of two (i.e., Q=2) with respect to number of sub-blocks, component decoders and the like, however this is not meant as a limitation. As would be apparent to those skilled in the art of the present invention, other values of "Q" may use to implement additional embodiments of the present invention without exceeding its scope.

Referring again to FIG. 4, the memory configuration for parallel decoding in outer decoding mode of the present invention is illustrated. The input sample memory 338 shown in FIG. 3 has been divided into two memory block pairs, XA 412, YOA 414, XB 416, and YOB 418. Similary, the extrinsic memory 350 shown in FIG. 3 has been divided into two memory blocks EA 440 and EB 450. Component decoder-1 420 reads in input samples from memory blocks XA 412 and YOA 414, extrinsic information from memory block EA 440, and writes its updated output to memory block EA 440, all in normal order (i.e., 0 to N−1). Similarly, component decoder-2 430 reads in input samples from memory block XB 416 and memory block YOB 418, extrinsic information from memory block EB 450, and writes its output to memory block EB 450, all in normal order. Sample inputs are collectively found in input sample memory 410. Interleaver address memory 372 shown in FIG. 3 is not illustrated in FIG. 4, but as will be discussed with reference to FIG. 6, has similarly been divided into memory blocks PA and PB.

The interleaver used in the present innvetion scrambles the order of sequential data. When the transmitted data is in an interleaved order, the received data can be recovered by undoing the interleaving, referred to as "de-interleaving." For example, a data frame with 8 data elements, d(0), d(1), d(2), . . . , d(7), is transimitted with the following interleaving pattern, (4, 7, 2, 0, 3, 6, 1, 5). Then the order of data reception in the receiver is d(4), d(7), d(2), . . . , d(5). The interleaver table simply holds the interleaving pattern. In this example the interleaver table would appear as noted below in Table 1:

TABLE 1

| Address Counter, k | Interleaved Address, k' |
| --- | --- |
| 0 | 4 |
| 1 | 7 |
| 2 | 2 |
| 3 | 0 |
| 4 | 3 |
| 5 | 6 |
| 6 | 1 |
| 7 | 5 |

In turbo coding the interleaving pattern is coder specific. That is, different coders use different sizes of data frame and different interleaving pattern. In the present invnetion, all that is necessary is that there is a table that defines the interleaving pattern. Methods of interleaving are known in the art and all have applicability in the present invention.

As a consequence of dividing the symbol data into two blocks, the final node state 460 condition of component decoder-1 420 and initial node state 470 condition of component decoder-2 430 are unknown. Using a training algorithm, such state conditions can be reliably obtained. Training for initial conditions requires the use of symbol data over T symbols prior to the initial node and training for final conditions requires symbol data over T symbols following the final node, where T is approximately 5 to 6 times the constraint length of the code.

Figure 5:
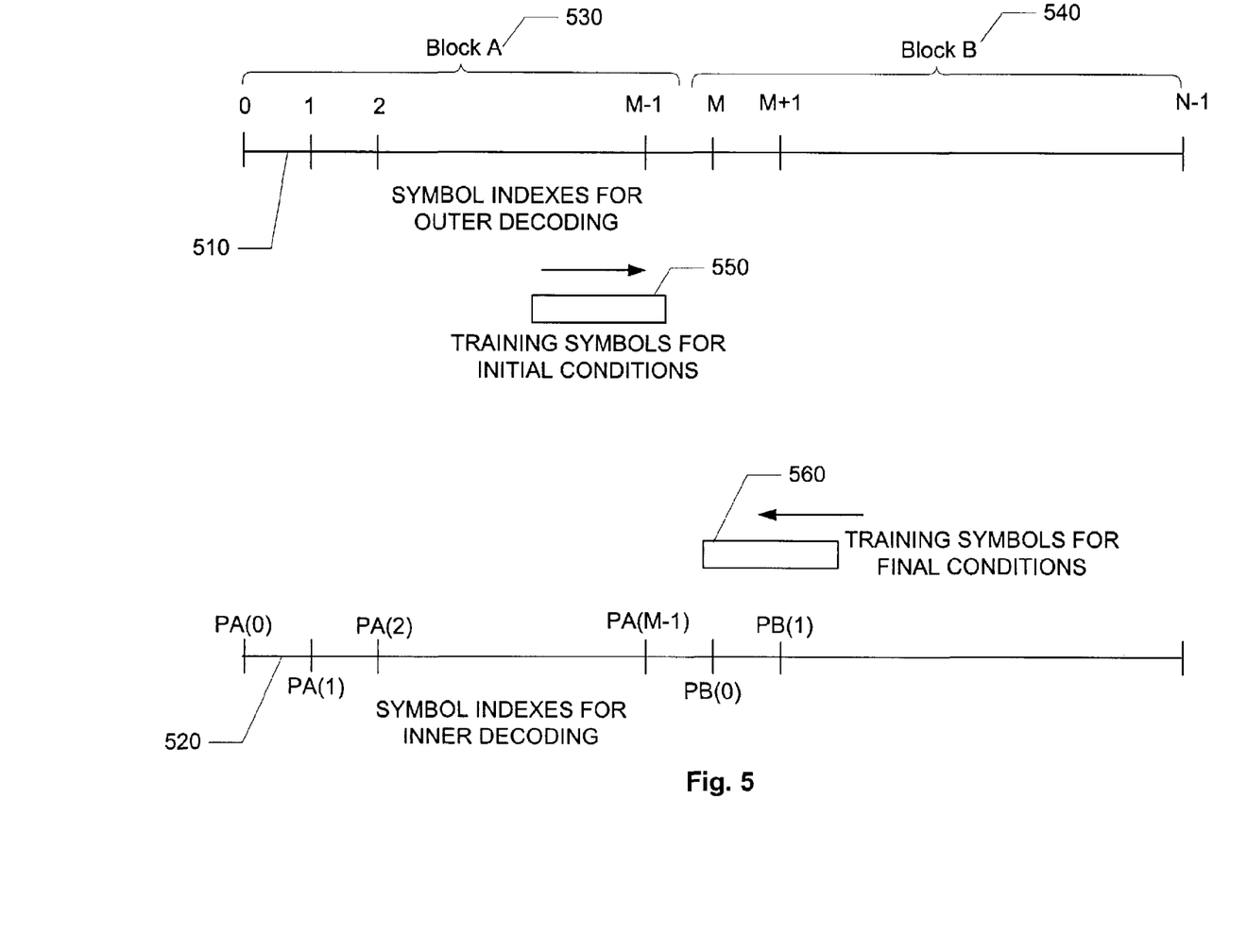
FIG. 5 illustrates partitioning of memories in terms of symbol indexes.

In FIG. 5, the partitioning of the memories is illustrated in terms of symbol indexes. The preferred embodiment of the present invention uses two sets of symbol indexes 510, 520. The "normal" ordered index 510 (ranging from 0 to N−1) is used for "outer" mode decoding. Half of the symbols are in Block-A 530. The rest of the symbols are in Block-B 540. The interleaved index 520, PA(0) through PA(M−1) and PB(0) through PB(N−M−1), is used for "inner" decoding. In this way, normal index order is used for outer decoding and interleaved index order is used for inner decoding. The first component decoder determines the initial node status for the second component decoder. Conversely, the second component decoder determines the final node status for the first component decoder. Further, FIG. 5 depicts partitioning of input and extrinsic information memories in terms of symbol indexes. In this scheme, component decoder-1 (illustrated in FIG. 4) processes symbol data from Block-A memories 530 and writes output back to Block-A memories 530. Likewise, component decoder-2 (illustrated in FIG. 4) processes symbol data from Block-B memories 540 and writes output back to Block-B memories 540.

As previously discussed, each component decoder decodes its Qth (half) portion of the data block. In order to effectively find a convergence of the decoded status of the encoded data, a final node status (for the decoder component decoding the first half of the data) and the initial node status (for the decoder component decoding the second half of the data) must be determined. This determination of the final node status and the initial node status is accomplished with a training algorithm. Locations of training symbols for initial conditions 550 and final conditions 560 are shown in FIG. 5. Note that training for final condition 560 is performed in component decoder-2 and training for initial conditions 550 in component decoder-1 since training data are only available to those decoders. Referring again to FIG. 4, at the end of training the final conditions 460 are sent to component decoder-1 420 and initial conditions 470 are sent to component decoder-2 430. Once the initial and final conditions of two component decoders are obtained, the two component decoders can be run independently of each other. Component decoder-1 420 communicates the initial node state to component decoder-2 430 along the arrow labeled "Initial Conditions" 470. Similarly, component decoder-2 430 communicates the final node state to component decoder-1 420 along the arrow labeled "Final Conditions" 460.

Referring to FIG. 5, decoding in outer decoding mode is illustrated. The input and extrinsic information memories are partitioned into two blocks, Block-A 530 and Block-B 540 of sizes M and (N−M), respectively, where M=(N+1)/2. The result is that parallel decoding of a code block with two component decoders can be implemented. Note that N−M is equal to M if N is even, or equal to M−1 if N is odd. The "initial" node index for outer decoding for component decoder-2 is "M"; the final node index for component decoder-1 is "M−1". The index for inner decoding initial node is "PB(0)" and for the final node is "PA(M−1)".

In the description of FIGS. 3–5 X, Y0, Y1 are are receive sample memories for a data frame. For each data bit, the transmitter adds two parity bits and transmits the data and first parity bits in normal order and the second parity bits in interleaved order. The receiver receives these bits in grey-scale values and stores them in memories. Thus the X-memory is for data samples received, Y0-memory for normal parity samples received, and Y1-memory for interleaved parity samples received. Since turbo coding is performed on a data frame basis, decoding can start only after all receive samples of a data frame are ready in X, Y0, and Y1 memories.

Figure 7:
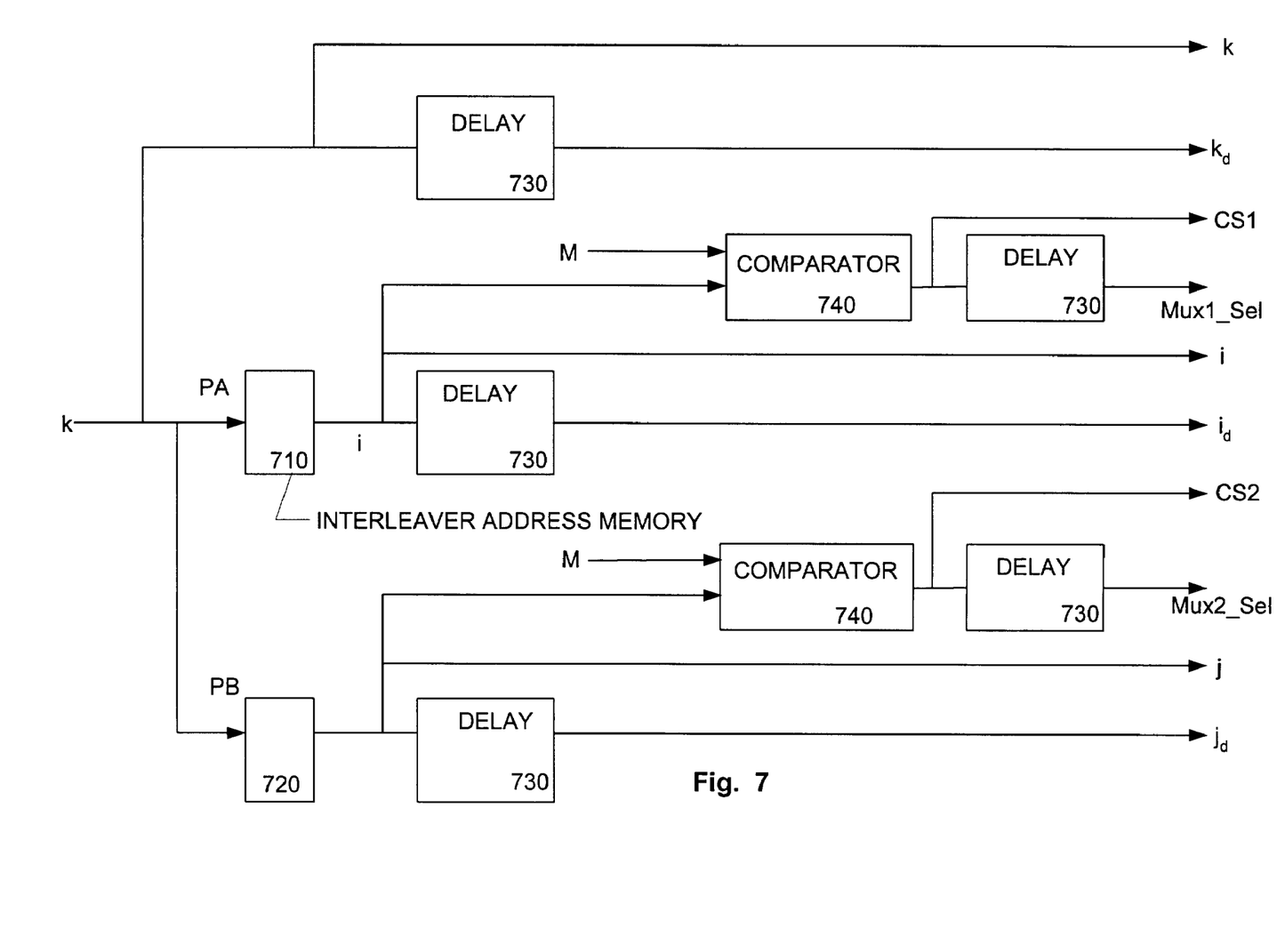
FIG. 7 illustrates address and memory access control signal generation logic for parallel decoding of turbo codes.

In inner decoding mode the scheme used for outer decoding does not apply since interleaved symbol data are spread over Block-A 530 as well as Block-B 540 memory partitions. As illustrated in FIG. 7, the present invention accounts for this difference by partitioning the interleaver address memory into two blocks, PA 710 and PB 720, and incorporating additional memory buffers 730.

Figure 6:
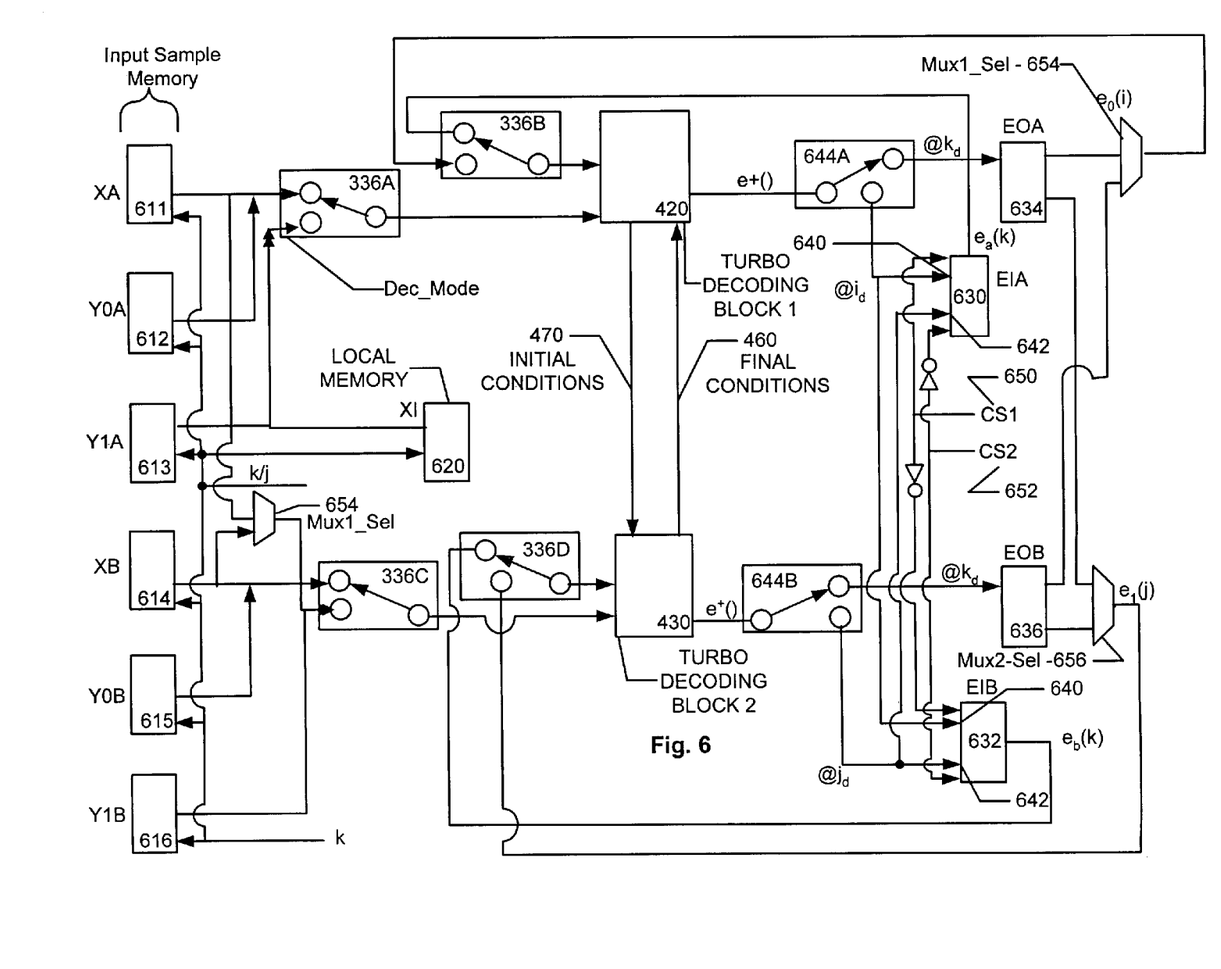
FIG. 6 illustrates a memory configuration scheme for parallel decoding of turbo codes.

Referring again to FIG. 6, a memory configuration scheme of a turbo decoder that supports parallel decoding of turbo codes by two component decoders in both outer decoding and inner decoding modes is illustrated. Certain values identified in FIG. 6 are derived from the partitioned interleaver address memory illustrated in FIG. 7. In this scheme a local memory XI 620 of size M and another set of dual port memories 630, 632 are added. The purpose of the local memory XI 620 is to store the first half of x(k) samples in interleaved order.

For inner decoding in this scheme component decoder-1 420 processes interleaved symbol data corresponding to symbol indexes of PA and component decoder-2 430 processes interleaved symbol data corresponding to symbol indexes of PB. The use of two sets of dual port memories 630, 632 allows two component decoders 420, 430 to independently access extrinsic information. The use of the local memory XI 620, on the other hand, permits two component decoders to independently access input sample data. This memory configuration therefore, makes it possible for two component decoders to run independently of each other.

Specifically, component decoder-1 reads and writes data when X-Y memory mode switch 336A is in the associated position using the following logic:

Input sample read from XI 620 and input parity dataY1A 613 in normal order with k, k=0, 1, . . . , M−1.

Extrinsic information read with i=PA(k). Select EOA 634 if i<M,

Select EOB 636 otherwise.

Extrinsic information write to EIA 630 or EIB 632 with $i_d$, where $i_d$ is a delayed version of i. Select EIA 630 if $i_d$<M, Select EIB 632 otherwise.

The generation of the logic control signals is illustrated in FIG. 7.

Similarly, component decoder-2 430 reads and writes data when X-Y memory mode switch 336C is in the associated position using the following logic:

Input sample read from XA 611 or XB 614 in interleaved order with j=PB(k)

Select XA 611 if j<M, XB 614 otherwise.

Read Y1B 616 in normal order with k.

Extrinsic information read with j. Select EOA 634 if j<M, EOB 636 otherwise.

Extrinsic information write to EIA 630 or EIB 632 with $j_d$, where $j_d$ is a delayed version of j. Select EIA 630 if j<M, EIB 632 otherwise.

Again, the generation of the logic control signals is illustrated in FIG. 7.

For simultaneous accesses of dual port memories by two component decoders, Port-1 640 of dual port memories 630, 632 is assigned to component decoder-1 420 and Port-2 642 to component decoder-2 430. Control signal 1 (CS1) 650 and control signal 2 (CS2) 652 (illustrated in both FIG. 6 and FIG. 7) provide port control signals to corresponding ports 640, 642. Note that the dual port memories, EOA 634 and EOB 636, can be replaced by two sets of single port memories since dual accesses are needed only for read operations.

Read/write switches 644A and 644B select the reading or writing operation for each component decoder. When writing, the switch arrow in the read/write switch 644A and 644B is in the "down" position. The extrinsic inner (EI) buffer "A" or "B" logic (discussed previously) is illustrated in FIG. 6 as being controlled by CS1 650 and CS2 652. Selection of which outer decoder extrinsic buffer, EOA 634 or EOB 636, to be used in the next iteration for component decoder-1 is controlled by multiplexor selector signal 1 (Mux1_Sel) 654 (illustrated in both FIG. 6 and FIG. 7). Multiplexor selector signal 2 (Mux2_Sel) 656 (illustrated in both FIG. 6 and FIG. 7) controls which extrinsic buffer will be used by component decoder-2 in the next decoder iteration. The generation of the logic control signals is illustrated in FIG. 7.

Figure 8A:
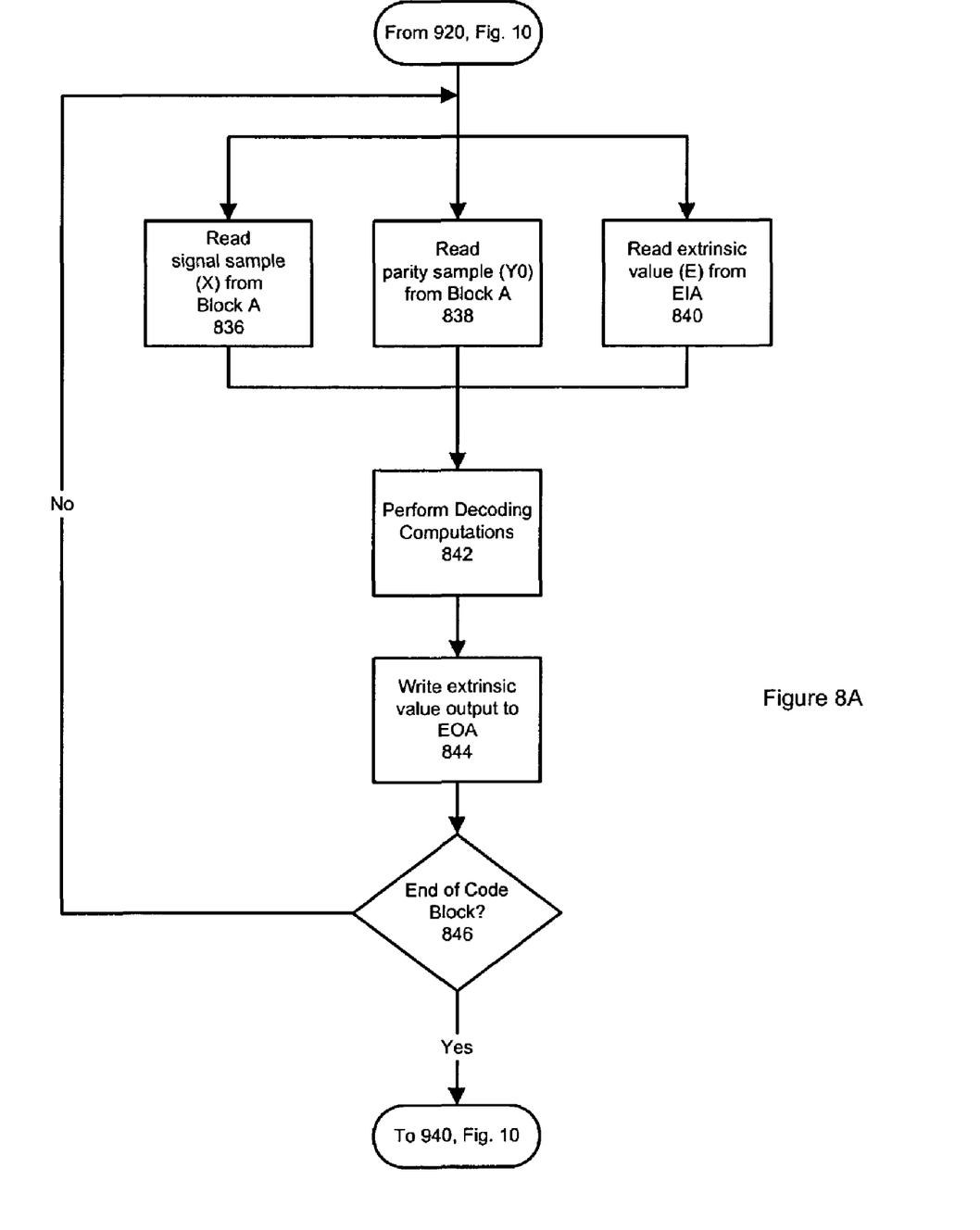
FIG. 8A illustrates the process of decoding in the outer mode using component decoder-1.
Figure 9A:
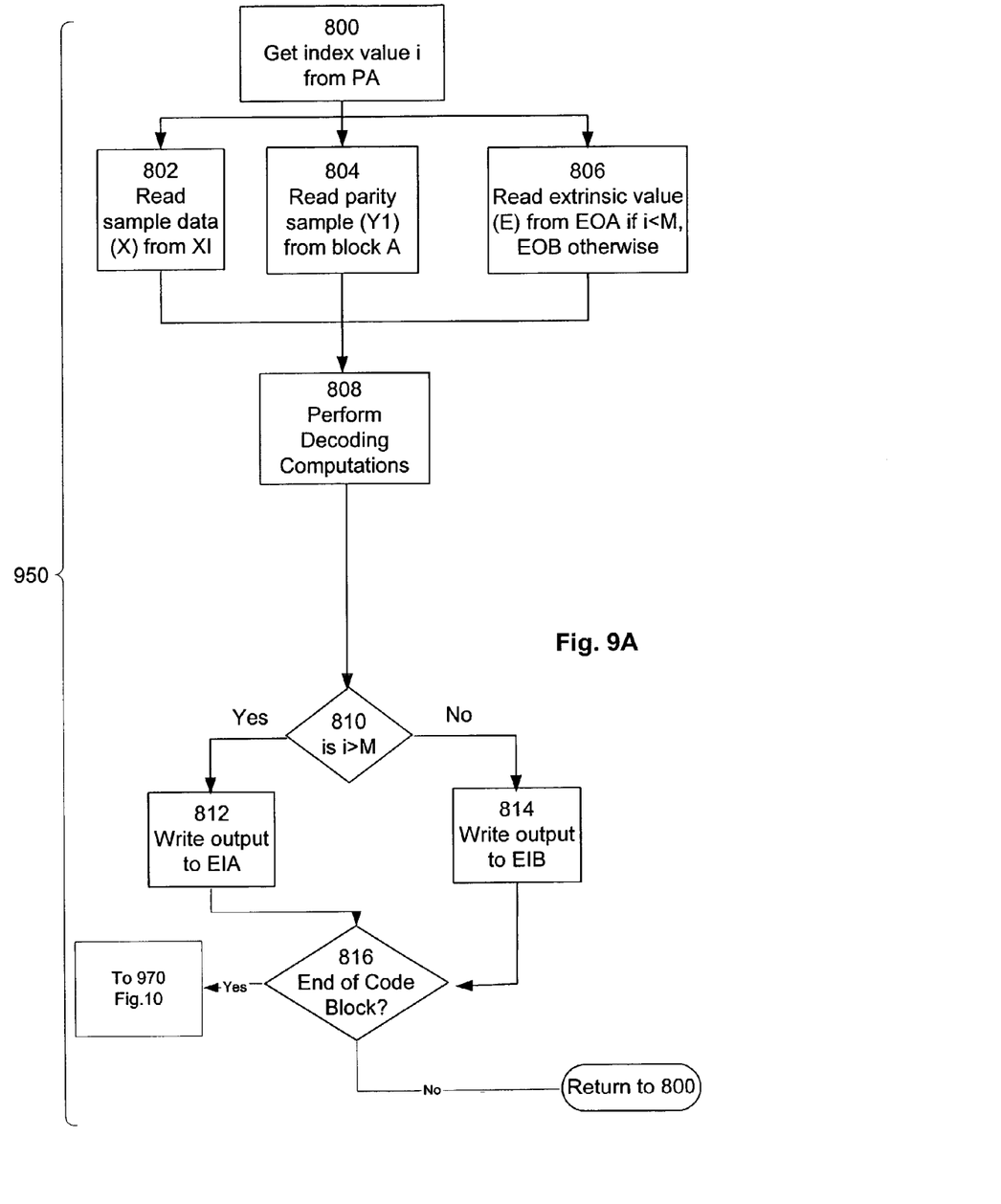
FIG. 9A illustrates the process of decoding in the inner decoding mode in component decoder-1.

Referring to FIG. 8A, the process of decoding in the outer decoding mode in decoder block component-1 is illustrated. Component decoder-1 reads a single sample value X from block A 836. The decoder further reads a parody sample (y0) form block A 838 and an extrinsic value (E) from EIA 840. Using this information decoding computations are then performed 842 and an intrinsic value is output to EOA 844. The decoder next determines if the end of the code block has been reached 846 and if so, the value is passed to the inner decoding mode 940 (FIG. 9) if the end of the code block has not been reached 846, the decoder returns to read further samples and be in the process again.

Figure 8B:
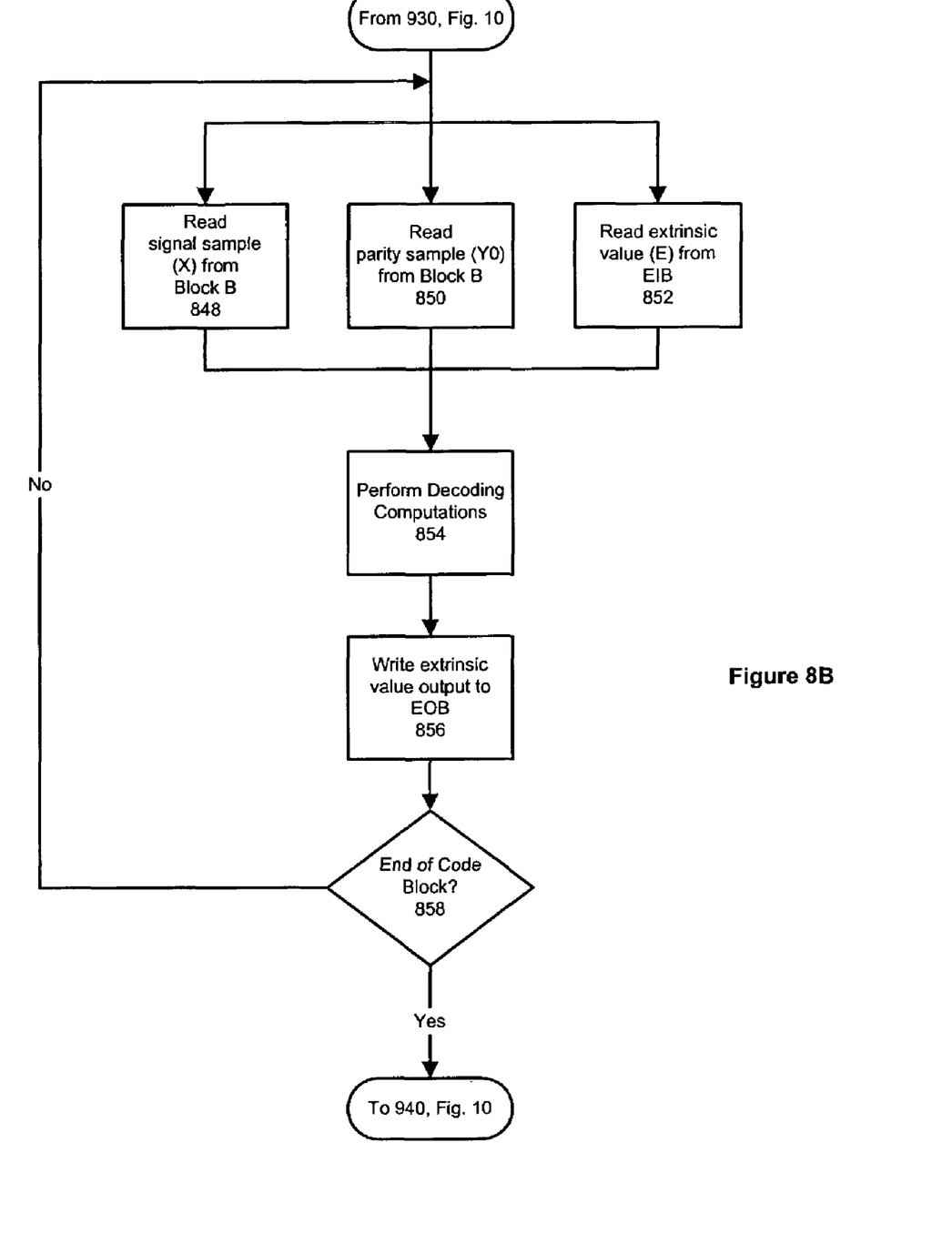
FIG. 8B illustrates the process of decoding in the outer mode using component decoder-2.
Figure 9B:
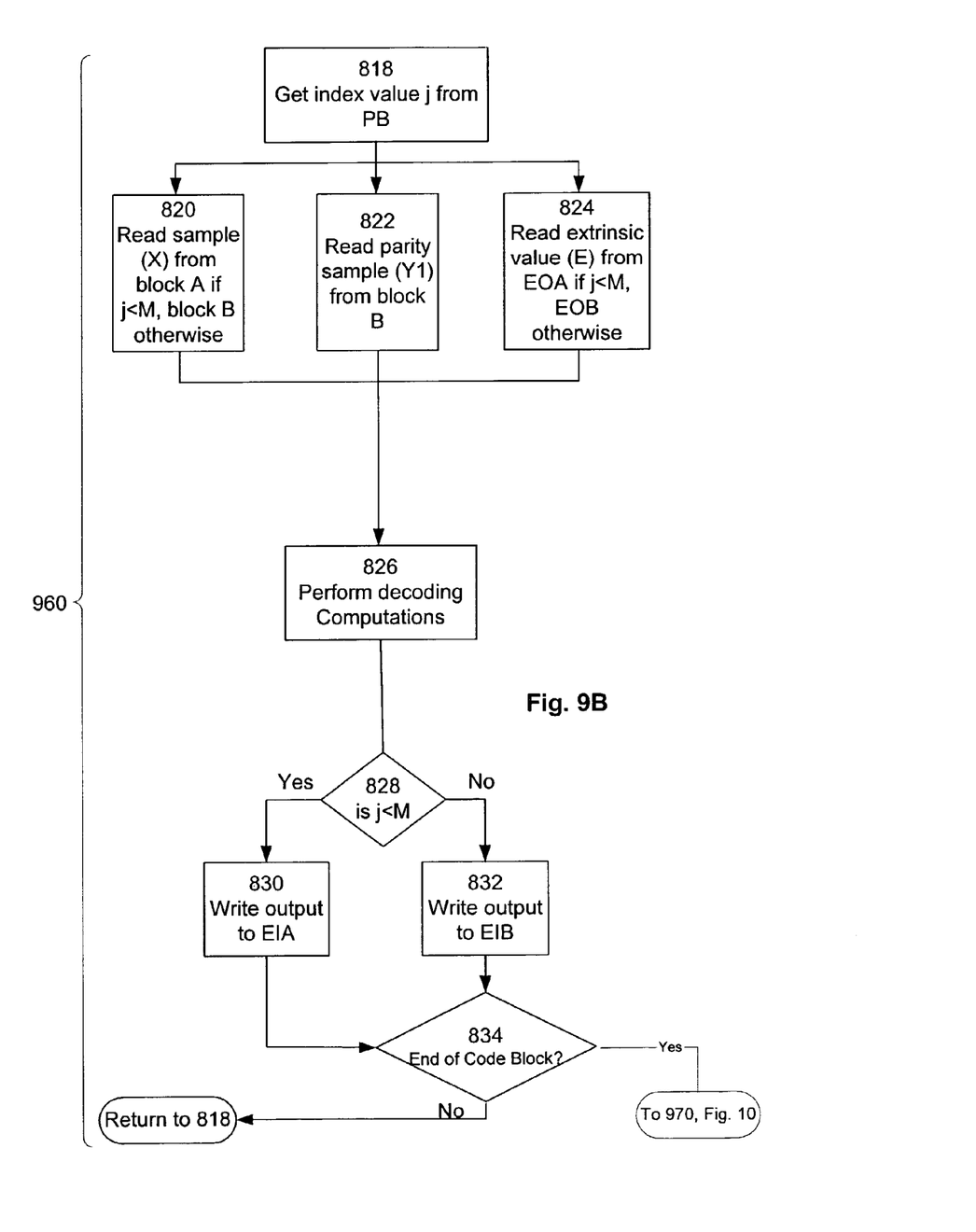
FIG. 9B illustrates the process of decoding in the inner decoding mode in component decoder-2.

Referring that to FIG. 8B the process of decoding in the outer mode in component decoder 2 is illustrated. In this instance the decoder reads signal sample (X) from block B 848, a parody sample (Y0) from block B 850 and an extrinsic value (E) from EIB 852. Thereafter, decoding computations are performed 854 and an extrinsic value is output to EOB 856. The decoder next determines if the end of the code block has been reached 858 and if so the value is presented to the inner decoding mode 940 (FIG. 9). If the end of the code block has not been reached the decoder retrieves another sample and performs the operations again until the end of the code block is reached.

Note that inner mode processing commences after the block A and block B have been processed in the outer mode. Referring now to FIG. 9A component decoder-1 receives index value i from memory PA 800. Sample data corresponding to index value i is read from memory XI 802, parity sample data is read from memory Y1A 804, and extrinsic data is read from EOA if i<M or from EOB otherwise 806. The data are the decoded 808 and the output is routing according to decision logic 810. The output is written to EIA 812 if i<M or to EIB 814. If the end of the code block has not been reached 816, the processing continues 800.

Referring to FIG. 9B the process of decoding in the inner decoding mode in component decoder-2 is illustrated. Note that the operation of component decoder-2 occurs in parallel with the operation of component decoder-1. Component decoder-2 receives index value j from memory PB 818. Sample data is read from memory XA if j<M or from XB otherwise 820, parity sample data is read from memory Y1B 822, and extrinsic data is read from EOA if j<M or EOB otherwise 824. The data are then decoded 826 and routed according to decision logic 828 and the output is written to EIA if j<M 830 or to EIB 832. If the end of the code block has not been reached 834, the processing continues 818.

Figure 10:
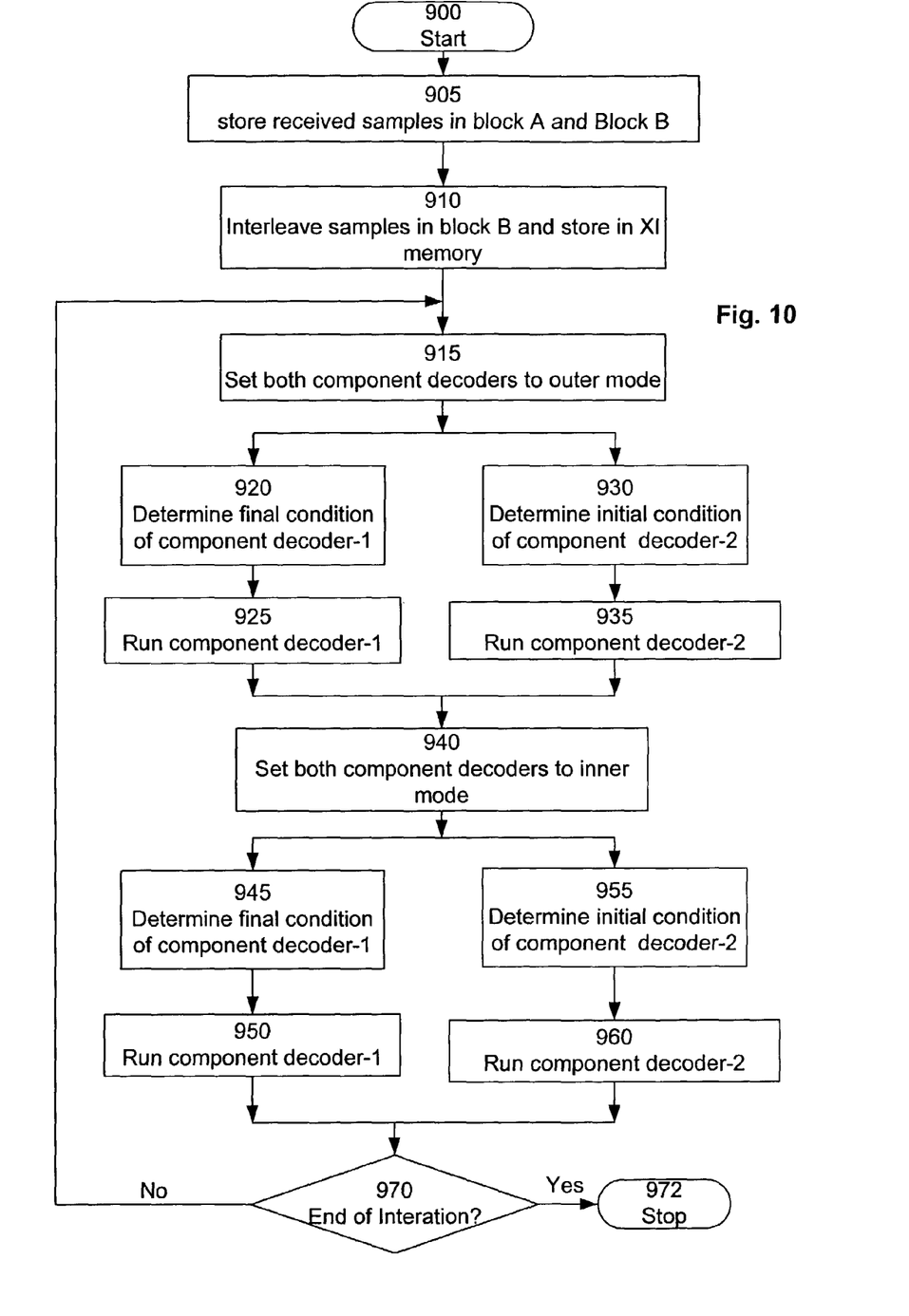
FIG. 10 illustrates the process of decoding in the outer and inner modes in both component decoder-1 and component decoder-2.

Referring to FIG. 10, the process of decoding in the outer and inner mode using both component decoder-1 and component decoder-2 is illustrated. Parallely concatentated constituent code (PCCC) 900 is received and is partitioned into two equal blocks, block A and block B 905. Each block comprises a data sample, a sequential parity data sample, and an interleaved data sample. Block A is decoded by component decoder-1 and block B is decoded by component decoder-2 in parallel. The samples in block B are interleaved and stored in XI memory 910. Both decoder component-1 and decoder component-2 are set to outer mode 915. The final condition of component decoder-1 is determined 920 and component decoder-1 is run in the outer mode 925. In parallel, the initial condition of component decoder-2 is determined 930 and component decoder-2 935 is run in the outer mode. Upon completion of the outer mode decoding of blocks A and B, both component decoder-1 and component decoder-2 are set to the inner mode 940. The final condition of outer decoder 1 is determined 945 and component decoder-1 is run in the inner mode 950. In parallel, the initial condition of component decoder-2 is determined 955 and component decoder-2 is run in the inner mode 960. Upon completion of the inner decoding of blocks A and B, the output is check for a stop condition 970. If the stop condition has been achieved, the decoding process ends 980. Otherwise, blocks A and B are subject to further interations of outer and inner decoding Outer mode decoding is completed when all data, normal parity samples, and current extrinsic values (X, Y0, E) of a data frame are used up to update extrinsic values. Inner mode decoding is completed when all data, interleaved parity samples, and current extrinsic values (X, Y1, E) of a data frame are used up to update extrinsic values. After inner mode operation decoding goes back to outer mode and extrinsic values keep updated. Decoding may end by applying hard-decisions to extrinsic values after a fixed number of iterations.

In another embodiment of the present invention, the interleaver table is generated internally and stored in interleaver address memory 710. In this embodiment, the XI memory 620 is initialized while the interleaver address generation is performed. The interleaver table is generated and stored in the interleaver address memory 710 during the first pass of outer decoding as the interleaver table is needed only for inner decoding. By starting the process of initializing the XI memory 620 as soon as the first half of the interleaver table is generated, the process of initializing the XI memory 620 can be completed approximately at the same time the interleaver table generation and storage is completed. In this way the processing time associated with the setting up the XI memory 620 does not impact the decoding time.

A memory configuration scheme enabling parallel decoding of turbo codes has now been illustrated. As described herein, the memory configuration results in significant improvement in the decoding rate without increasing the rate of the memory access clock. It will also be understood that the invention may be embodied in other specific forms without departing from the scope of the invention disclosed and that the examples and embodiments described herein are in all respects illustrative and not restrictive. Those skilled in the art of the present invention will recognize that other embodiments using the concepts described herein are also possible.

We claim:

1. A method of decoding a parallelly concatentated constituent code (PCCC Code) block of N symbols using a turbo decoder operating in the outer mode wherein the turbo decoder comprises first and second component decoders and wherein the method comprises:
   partitioning the PCCC block into a first input block of M symbols and a second input block of N−M symbols, where M equals one half (N+1);
   decoding the first input block at the first component decoder;
   decoding the second input block at the second component decoder; and
   wherein decoding the first input block and decoding the second input block is performed concurrently and in parallel.

2. A method of decoding a parallelly concatentated constituent code (PCCC Code) block of N symbols using a turbo decoder operating in the inner mode wherein the turbo decoder comprises first and second interleaver memories and first and second component decoders, and wherein the method comprises:
   storing in sequential order the first interleaver address memory a first index value associated with each of M symbols of the PCCC block, where M equals one half (N+1) and wherein the memory address associates with a first index value;
   storing in sequential order in the second interleaver address memory a second index value associated with each of N−M symbols of the PCCC block;
   processing at the first component decoder at interval K the symbol associated with the Kth first index value, where K is an integer in the range of 0 to M−1;
   processing at the second component decoder the symbol associated with the Kth second index value; and
   wherein the processing at the first component decoder and the second component decoder is performed in parallel.

3. The method as in claim 2 wherein the decoder further comprises a local memory and wherein the method further comprises storing in the local memory the interleaved symbol data associated with the unique first index value and wherein processing at the first component decoder at interval K the symbol associated with Kth first index value comprises reading at interval K the interleaved symbol data stored in the local memory associated with the Kth first index value.

4. A method of decoding a parallelly concatentated constituent code (PCCC Code) block of N symbols using a turbo decoder operating in an outer mode, wherein the turbo decoder comprises first and second input memories, first and second extrinsic memories, and first and second component decoders, and wherein the method comprises:
   partitioning the PCCC block into a first input block of M symbols and a second input block of N−M symbols, where M equals one half (N+1);
   storing the first input block in the first input memory and the second input block in the second input memory;
   processing at the first component decoder the first input block read from the first input memory and a first set of extrinsic data read from the first extrinsic memory;
   writing the output of the first component decoder to the first extrinsic memory;
   processing at the second component decoder the second input block read from the second input memory, a second set of extrinsic data read from the second extrinsic data memory;
   writing the output of the second component decoder to the second extrinsic memory, and
   wherein the processing at the first and second component decoders is performed in parallel.

5. A method of decoding a parallelly concatentated constituent code (PCCC Code) block of N symbols using a turbo decoder operating in an inner mode, wherein the turbo decoder comprises first and second input memories, first and second outer extrinsic memories, first and second inner extrinsic memories, wherein the first and second inner extrinsic memories comprise dual port memories, first and second interleaver address memories, local memory, and first and second component decoders, and wherein the method comprises:
   partitioning the PCCC block received at the decoder into a first input block of M symbols and a second input block of N−M symbols, where M equals one half (N+1);
   storing the first block in the first input memory and the second block in the second input memory;
   associating with each of M symbols stored in the first and second input memories a unique first index value and storing in sequential order the unique first index value in the first interleaver address memory;
   associating with each of N−M symbols stored in the first and second input memories a unique second index value and storing in sequential order the unique second index value in the second interleaver address memory;
   storing in the local memory the interleaved symbol data associated with the unique first index value;
   processing at the first component decoder at interval K the symbols associated with the Kth first index value in the local memory and a first set of extrinsic data associated with the Kth first index value wherein the first set of extrinsic data is read from the first outer extrinsic memory if the Kth first index value is less than M and is read from the second outer extrinsic memory if the Kth first index value is equal to or greater than M and where K is an integer in the range of 0 to M−1;
   writing the output of the first component decoder to the first inner extrinsic memory if the Kth first index value is less than M and writing to the second inner extrinsic memory if the Kth first index value is equal to or greater than M; and
   processing at the second component decoder at interval K each of N−M symbols associated with the Kth second index value and a second set of extrinsic associated with the Kth second index value wherein the N−M symbol is read from the first input memory if the Kth second index value is less than M and is read from the second input memory if the Kth second index value is equal to or greater than M, and wherein the second set of extrinsic data is read from the first outer extrinsic memory if the Kth second index value is less than M and is read from the second outer extrinsic memory if the Kth second index value is equal to or greater than M;
   writing the output of the second component decoder to the first inner extrinsic memory if the Kth second index value is less than M and writing to the second inner extrinsic memory if the Kth second index value is greater than or equal to M; and
   wherein the processing at the first and second component decoders is performed in parallel.

* * * * *